US008675681B2

(12) United States Patent
Hill et al.

(10) Patent No.: US 8,675,681 B2
(45) Date of Patent: Mar. 18, 2014

(54) COMMUNICATION WITHIN AN INTEGRATED CIRCUIT INCLUDING AN ARRAY OF INTERCONNECTED PROGRAMMABLE LOGIC ELEMENTS

(75) Inventors: Stephen John Hill, Cambridge (GB); Michael Peter Muller, Cambridge (GB)

(73) Assignee: ARM Limited, Cambridge (GB)

( * ) Notice: Subject to any disclaimer, the term of this patent is extended or adjusted under 35 U.S.C. 154(b) by 318 days.

(21) Appl. No.: 13/138,109

(22) PCT Filed: Jan. 6, 2010

(86) PCT No.: PCT/GB2010/000012
§ 371 (c)(1),
(2), (4) Date: Jul. 7, 2011

(87) PCT Pub. No.: WO2010/079326
PCT Pub. Date: Jul. 15, 2010

(65) Prior Publication Data
US 2011/0268137 A1    Nov. 3, 2011

(30) Foreign Application Priority Data
Jan. 8, 2009    (GB) .................................. 0900267.6

(51) Int. Cl.
*H04J 3/16*    (2006.01)
(52) U.S. Cl.
USPC ........................................... 370/466; 326/38
(58) Field of Classification Search
None
See application file for complete search history.

(56) References Cited

U.S. PATENT DOCUMENTS

| | | |
|---|---|---|
| 5,761,483 A | 6/1998 | Trimberger |
| 5,861,761 A | 1/1999 | Kean |
| 6,057,708 A | 5/2000 | New |
| 6,552,410 B1 | 4/2003 | Eaton et al. |
| 6,772,230 B2 | 8/2004 | Chen et al. |
| 6,891,397 B1 * | 5/2005 | Brebner ........................ 326/41 |
| 6,894,530 B1 | 5/2005 | Davidson et al. |
| 7,084,664 B1 | 8/2006 | Lee et al. |
| 7,268,581 B1 * | 9/2007 | Trimberger et al. ............ 326/38 |
| 7,375,550 B1 | 5/2008 | Redgrave et al. |
| 7,380,035 B1 | 5/2008 | Donlin |
| 2003/0163798 A1 | 8/2003 | Hwang et al. |
| 2004/0068711 A1 * | 4/2004 | Gupta et al. .................... 716/18 |
| 2007/0247189 A1 | 10/2007 | Phil et al. |

OTHER PUBLICATIONS

UK Search Report for GB Application No. 0900267.6, dated May 7, 2009.
International Preliminary Report on Patentability for PCT/GB2010/000012 with Amended Sheets, mailed Apr. 12, 2011.
International Search Report for PCT/GB2010/000012, mailed Jul. 13, 2010.
Written Opinion of the International Searching Authority for PCT/GB2010/000012, mailed Jul. 13, 2010.

* cited by examiner

*Primary Examiner* — Jianye Wu
(74) *Attorney, Agent, or Firm* — Nixon & Vanderhye P.C.

(57) ABSTRACT

An integrated circuit includes an array of interconnected programmable logic elements (2) each logic element performing data processing control by a configuration. The logic elements may be part of a field programmable gate array. Embedded within the array are a plurality of dedicated communication interface circuits (36) providing access to one or more shared communication channels (38) to provide intra-array communication. Communication transactions between functional unit (78, 80, 82, 84) are multiplexed (e.g. time-division-multiplexed) together to share a shared communication channel provided within the array.

25 Claims, 11 Drawing Sheets

COMMUNICATION WITHIN AN INTEGRATED CIRCUIT INCLUDING AN ARRAY OF INTERCONNECTED PROGRAMMABLE LOGIC ELEMENTS

This application is the U.S. national phase of International Application No. PCT/GB2010/000012 filed 6 Jan. 2010 which designated the U.S. and claims priority to GB Application No. 0900267.6, filed 8 Jan. 2009, the entire contents of each of which are hereby incorporated by reference.

This invention relates to the field of integrated circuits. More particularly, this invention relates to the field of integrated circuits comprising an array of interconnected programmable logic elements (e.g field programmable gate array integrated circuits) and the communication mechanisms within such integrated circuits.

It is known to provide integrated circuits comprising an array, or other regular structure, of interconnected programmable logic elements. Field programmable gate array integrated circuits are one example of this type of integrated circuit. These integrated circuits are useful for a variety of different purposes. One example use is for emulating an integrated circuit design before that integrated circuit design is manufactured. Another use is providing an integrated circuit with a desired functionality without having to manufacture a specific integrated circuit to provide that functionality.

One way of using such arrays of interconnected programmable logic elements is to use them to implement significant functional circuitry blocks known as macrocells (in the sense of system-on-chip (SOC) designs. Such macrocells typically correspond to functional units such as a processor core, a memory controller, a DSP engine, or other major portions of a typical system-on-chip integrated circuit design. These macrocells may be designed and provided by the same company, or from a collection of different companies. This design style in which a significant proportion of the design consists of macrocells connected using shared communication channels, such as buses or networks, will be recognised as SOC design. When the macrocells are implemented using the array of interconnected programmable logic elements, they often require a communication mechanism to be established between the macrocells implemented upon the array and between the design implemented upon the array and the circuit elements outside the array.

Figure 1:
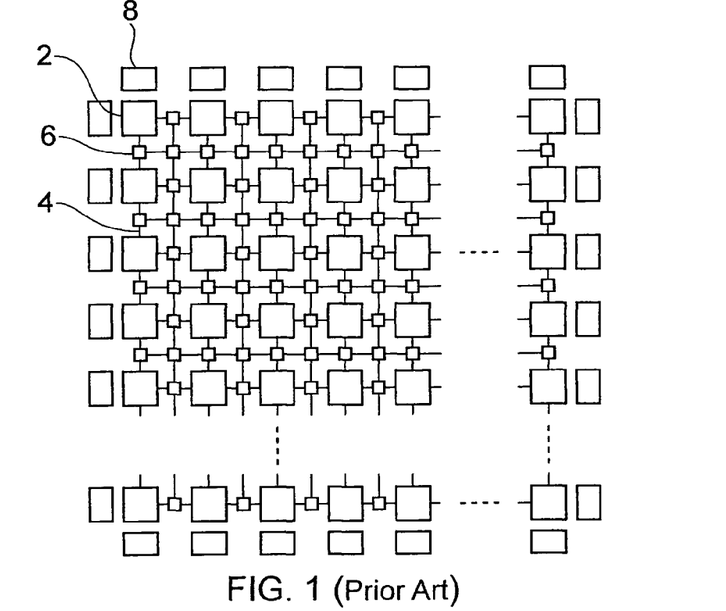
FIG. 1 schematically illustrates an array of interconnected programmable logic elements.

FIG. 1 of the accompanying drawings schematically illustrates a known array of interconnected programmable logic elements. This array includes a plurality of programmable logic elements 2 connected via one or more conductors 4 and configurable switch blocks 6. The conductors 4 and configurable switch blocks 6 allow the programmable logic elements 2 to be connected to one another in a flexible manner. In some arrays there are also provided configurable input/output blocks 8 around the periphery of the array for providing individual signal communication with circuits external of the array.

Figure 2:
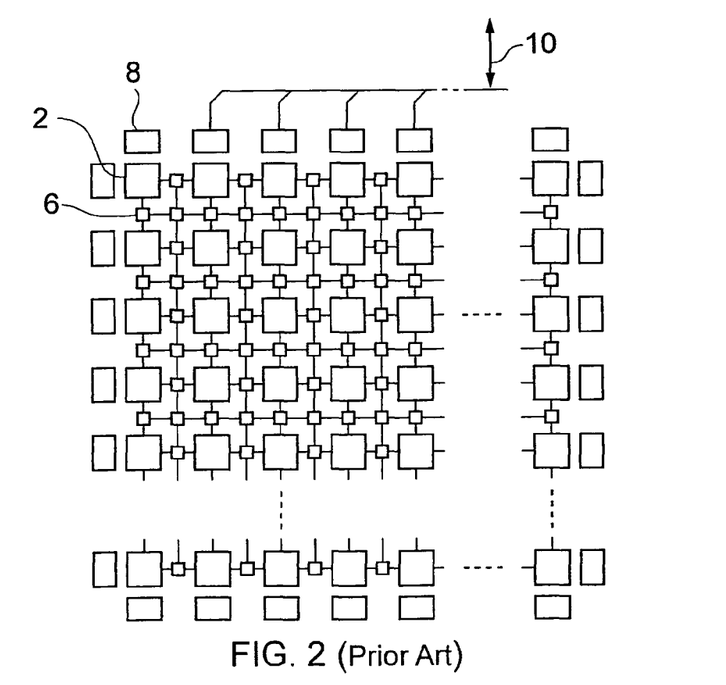
FIG. 2 schematically illustrates the array of FIG. 1 communicating with an external communication channel.

FIG. 2 of the accompanying diagrams schematically illustrate how the array of FIG. 1 may use the configurable input/output blocks 8 to connect to an outside communication mechanism (such as a communication interconnect (e.g. an AXI interconnect as provided by ARM Limited of Cambridge, England)). In this way, macrocells instantiated within the array may link to a communication mechanism outside the array using existing communication protocols and methods. The example of FIG. 2 uses the programmable logic elements 2 within the array to serve as a bus interface unit for driving an external communication channel 10. While the programmable logic elements 2 permit such a use, the approach consumes the resources of the array and renders the programmable logic elements so used unavailable for other purposes.

Figure 3:
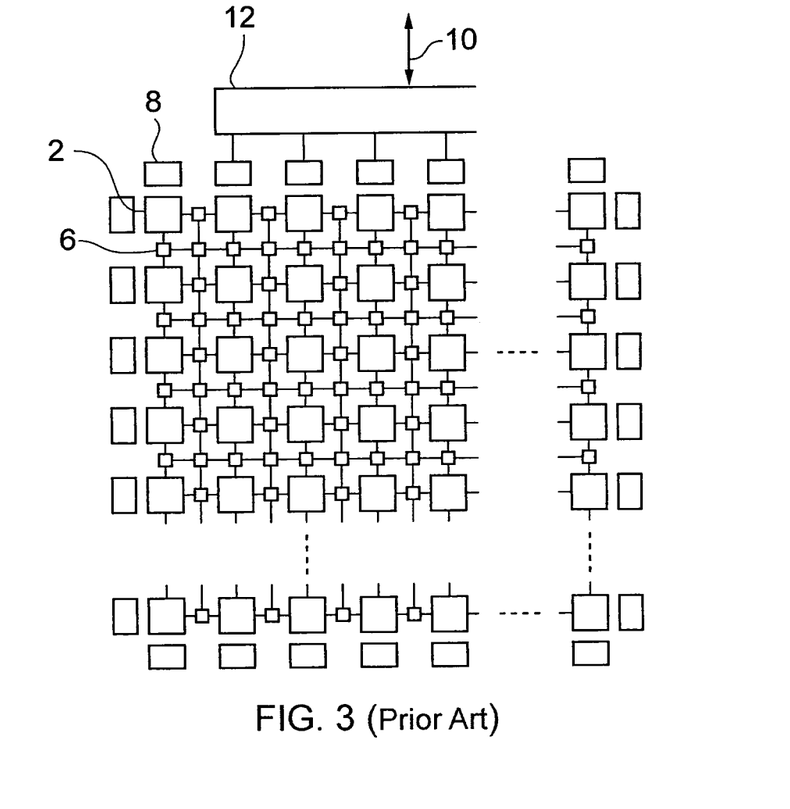
FIG. 3 schematically illustrates the array of FIG. 1 communicating with an external communication channel via a dedicated bridge circuit.

FIG. 3 of the accompanying drawings illustrates another known possibility. In this example a dedicated hardware bus interface unit 12 is provided external of the array and provides a link between the configurable input/output blocks 8 and the external communication channel 10. The provision of such a dedicated hardware bus interface unit 12 has the result that fewer programmable logic elements 2 need to be consumed within the array in order to drive the external communication channel 10.

Figure 4:
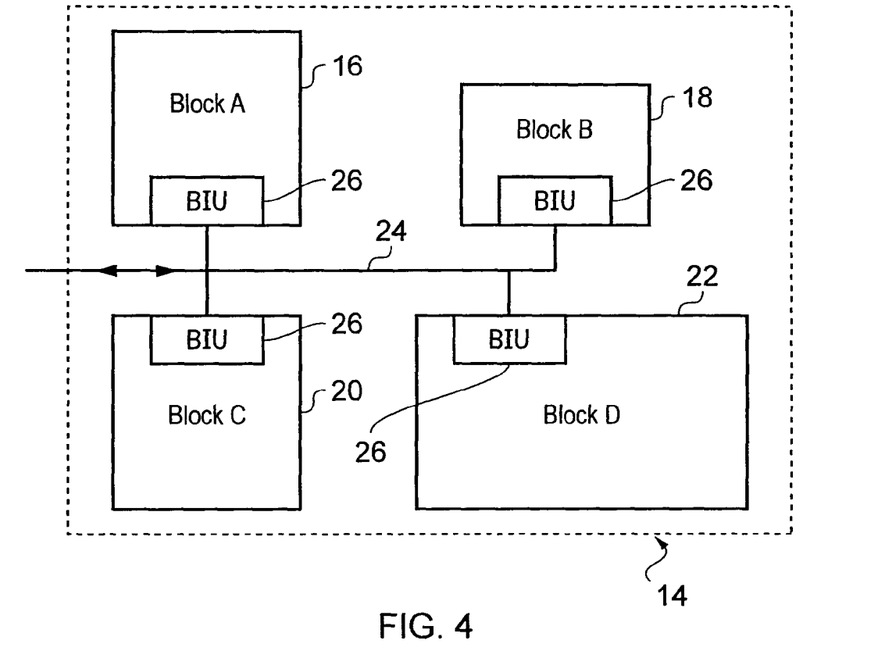
FIG. 4 schematically illustrates one way in which macro blocks implemented within an array of interconnected programmable logic elements may communicate via a shared communication channel.

With the increasing use of macrocells implemented using arrays of interconnected programmable logic elements, and the recognition that such macrocells are often designed to communicate via shared communication channels, it becomes desirable to support such shared communication channels for communication within the array itself FIG. 4 of the accompanying drawings illustrates such an arrangement. In this arrangement an integrated circuit includes an array of interconnected programmable logic elements 14 illustrated as bounded by a dashed line. Instantiated within this array 14 are a plurality of macrocells 16, 18, 20, 22. These macrocells 16, 18, 20, 22 communicate with each other and with circuit elements outside the array 14 via a shared communication channel 24. This shared communication channel 24 may be an instantiation of a conventional interconnect, or communication channel such as an AXI interconnect, provided in the form of a suitably programmed number of the programmable logic elements within the array 14. The macrocells 16, 18, 20, 22 will typically already include within their design a bus interface unit 26 for communicating with the shared communication channel with which they are intended to communicate. This approach of providing integrated circuits, such as system-on-chip integrated circuits, by combining a plurality of macrocells communicating via a shared communication channel will be familiar in the context of dedicated hardware such as application specific integrated circuits. Such dedicated hardware does not use arrays of programmable logic elements and typically will be more efficient and higher performance, but without the flexibility provided by the programmable logic elements.

It is known to provide arrays of interconnected programmable logic elements with embedded special purpose hardware, such as multipliers, RAM arrays and the like as these are commonly used.

It is desirable to increase the efficiency with which programmable logic elements within an array of interconnected programmable logic elements are used to provide the required functionality.

Viewed from one aspect the present invention provides an integrated circuit comprising: an array of interconnected programmable logic elements, each logic element performing data processing controlled by a configuration stored after manufacture into said logic element; one or more shared communication channels providing intra-array communication within said array; and a plurality of dedicated communication interface circuits distributed within said array, said dedicated communication interface circuits providing access to said one or more shared communication channels; wherein said logic elements are configured to provide a plurality of functional units, each of said plurality of functional units having an interconnect interface for transferring communication transactions and coupled to one of said plurality of dedicated communication interface circuits; said plurality of dedicated communication interface circuits and said one or more shared communication channels are controlled by said configuration to emulate an interconnect circuit configured to transfer communication transactions between said plurality of functional units via a plurality of interconnect channels; and each of said one or more shared communication channels has a communication bandwidth greater than required to emulate one of said plurality of interconnect channels such that a plurality of interconnect channels share one of said one or more a shared communication channels.

The present invention recognises that the provision of dedicated communication interface circuits distributed within the array of interconnected programmable logic elements itself can provide an overall increase in efficiency as the increasing use of macrocells instantiated within such arrays often requires the use of communication interface circuits to provide access to one or more shared communication channels for intra-array communication. Thus, the area and gates consumed in providing the dedicated communication interface circuits instead of using programmable logic elements to provide this functionality justifies itself given the increased efficiency these provide and the relatively high likelihood of their use in SOC style designs.

Furthermore, the provision of dedicated communication interface circuits and the shared communication channels has the effect that the bandwidth of the dedicated communication mechanisms will typically be higher than the requirements of the functional units which are being provided by the configured logic elements rather than dedicated circuitry. This permits multiple channels of an interconnect circuit of the SOC being emulated to share one of the communication channels provided in a manner which advantageously reduces the communication overhead.

The shared communication channel(s) can be shared in a variety of ways, such as time-division-multiplexing, frequency-division-multiplexing or code-division-multiplexing.

It will be appreciated that the shared communication channels could be formed out of the standard elements of the array, such as the conductors and switch blocks. However, increased efficiency may be achieved when the one or more shared communication channels is also provided in the form of dedicated shared communication channel circuitry. The provision of such dedicated shared communication channel circuitry justifies its inclusion given the efficiency achieved and relatively high likelihood of use.

The shared communication channels could be formed in a variety of different ways, such as a standard bus structure, e.g. an AHB structure as provided by ARM Limited of Cambridge, England. However, an efficient way of interconnecting the logic elements is when the shared communication channel is formed as shared communication channel interconnect circuitry.

The present technique has usefulness when applied purely within the array itself. However, the usefulness of the technique is further enhanced when the one or more shared communication channels also provide communication with circuitry outside the array. The shared communication channel can provide an efficient mechanism for communication with one or more circuit elements outside the array. It will be appreciated that these circuit elements outside of the array may be on the same integrated circuit, or on a different integrated circuit.

It will be appreciated that integrated circuits composed entirely of the array of interconnectable programmable logic elements may be provided and are useful in many circumstances. However, one particular use of the present technique is an integrated circuit which includes both an array of interconnected programmable logic elements and at least one further data processing circuit outside of the array with the one-or-more shared communication channels providing communication between the logic elements within the array and the at least one further data processing circuit. Such a hybrid integrated circuit composed partially of the array of programmable logic elements and partially of dedicated further processing circuitry can provide a good blend of efficiency and flexibility.

It will be appreciated that the at least one further data processing circuit could take a variety of different forms. However, the present technique is well suited to embodiments in which the further data processing circuitry comprises a data processor responsive to a stream of program instructions to perform data processing operations, such as a processor core.

In order to facilitate communication between the array and circuitry outside of the array via the one or more of the shared communication channels, some embodiments may include dedicated bridge circuitry providing a link between the shared communication channel within the array and the circuitry outside of the array.

It will be appreciated that the dedicated communication interface circuits could transfer data between source and destinations in a variety of different ways. However, the present technique is well suited to providing shared communication channels using multi-bit transactions having an associated transaction protocol including control signalling to both the source and destination. Such transactional communication is frequently used within systems employing multiple macrocells and is efficient, flexible and robust.

In order to increase the efficiency of use of the shared communication channels within the array, the array may include arbiter circuitry (either dedicated or formed of programmable logic elements) serving to arbitrate access to the shared communication channels by the plurality of dedicated communication interface circuits within the array.

The routing of communications between the different dedicated communication interface circuits could be controlled in a variety of different ways. However, one efficient technique is to provide each dedicated communication circuit with one or more associated addresses such that a communication transaction is routed across the shared communication channels in dependence upon the destination address associated with that transaction.

While the one or more shared communication channels can have a variety of different forms with differing levels of performance and characteristics, one class of useful implementations is when the one or more shared communication channels completes a data transfer in a time dependent upon at least one of concurrent use of the channel for other data transfers and relative positions within the array of the source and destination. Shared communication channels may be subject to contention and accordingly availability of the channel and transfer times can vary depending upon usage. Furthermore, register stages may be in place along the communication channel which alter the time of transfer depending upon the distance to be covered across the array.

The plurality of dedicated communication interface circuits provided within the array can serve to provide control signals to the logic elements of the array implementing a macrocell with these control signals indicating information such as a dedicated communication channel not being able to accept more data for communication, that data sent for communication was lost and/or that data sent for communication has been received.

The plurality of dedicated communication interface circuits can contain a variety of different circuit elements useful in performing their operation. These circuit elements can include an output buffer for storing data to be transmitted prior to access to the one or more shared communication channels being obtained, and/or an input buffer for storing data received from one or more shared communication channels prior to the data being passed to the logic elements.

The dedicated communication channel interface circuits need not maintain the same communication protocol as is natively used by the macrocells with which they communicate. It may be more efficient if the dedicated communication channel interface circuits transfer data upon the shared communication channels at a number of bits per cycle differing from the number of bits per cycle at which the data is communicated between the logic elements and the dedicated communication channel interface circuits. Thus, the dedicated communication channel interface circuits may, for example, serve to serialise parallel data for communication over the shared communication channels.

In order to facilitate such different communication mechanisms/protocols being employed, a source dedicated communication channel interface circuit may encode data to a different form to the data received from the logic elements with a destination dedicated communication channel interface circuit then performing a complementary decode of that data before passing the data to its logic elements.

The shared communication channels within the array may be a flat shared structure. However, improved efficiency may be achieved when there is a hierarchy of shared communication channels linked by intra-array bridge circuitry.

It is also possible in some embodiments that the array may include a plurality of independent shared communication channels with such communication channels being shared between multiple macroblocks but independent of one another.

It will be appreciated that the shared communication channels can operate in accordance with a variety of different communication protocols and methodology. However, the technique is well suited to embodiments in which the shared communication channels comprise AMBA communication channels as provided by ARM Limited of Cambridge, England.

It will be appreciated that the array of interconnected programmable logic elements could take a variety of different forms. However, the technique is well suited to arrays in the form of a field programmable gate array or a time-multiplexed field programmable gate array.

Viewed from another aspect the present invention provides an integrated circuit comprising: an array of interconnected programmable logic element means for performing data processing controlled by a configuration stored after manufacture into said logic element means; one or more shared communication channel means for providing intra-array communication within said array; and a plurality of dedicated communication interface means distributed within said array for providing access to said one or more shared communication channel means; wherein said logic element means are configured to provide a plurality of functional units, each of said plurality of functional units having an interconnect interface for transferring communication transactions and coupled to one of said plurality of dedicated communication interface means; said plurality of dedicated communication interface means and said one or more shared communication channel means are controlled by said configuration to emulate an interconnect circuit configured to transfer communication transactions between said plurality of functional units via a plurality of interconnect channel means; and each of said one or more shared communication channel means has a communication bandwidth greater than required to emulate one of said plurality of interconnect channels such that a plurality of interconnect channels share one of said one or more a shared communication channel means.

Viewed from a further aspect the invention provides a method of communication within an integrated circuit having an array of interconnected programmable logic elements, each logic element performing data processing controlled by a configuration stored in said logic element, said method comprising the steps: communicating within said array using one or more shared communication channels and a plurality of dedicated communication interface circuits distributed within said array, said dedicated communication interface circuits providing access to said one or more shared communication channels; wherein said logic elements are configured to provide a plurality of functional units, each of said plurality of functional units having an interconnect interface for transferring communication transactions and coupled to one of said plurality of dedicated communication interface circuits; said plurality of dedicated communication interface circuits and said one or more shared communication channels are controlled by said configuration to emulate an interconnect circuit configured to transfer communication transactions between said plurality of functional units via a plurality of interconnect channels; and each of said one or more shared communication channels has a communication bandwidth greater than required to emulate one of said plurality of interconnect channels such that a plurality of interconnect channels share one of said one or more a shared communication channels.

Viewed from a further aspect the present invention provides a method of connecting a plurality of integrated circuit macrocells implemented by an array of interconnected programmable logic elements, said method comprising the steps of:
converting communication transactions between a native communication protocol of each macrocell and a native communication protocol of said array; and
passing communication transactions between said macrocells using said native communication protocol of said array.

Embodiments of the invention will now be described, by way of example only, with reference to the accompanying drawings in which.

Figure 5:
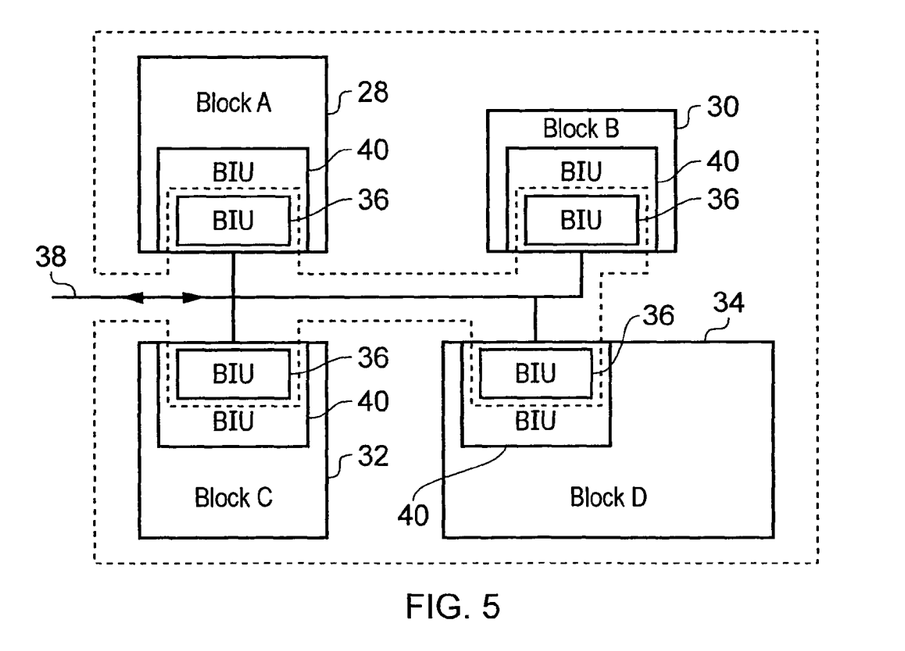
FIG. 5 schematically illustrates an embodiment of an integrated circuit including an array of interconnected programmable logic elements communicating via dedicated bus interface circuits and a shared communication channel disposed within the array.

FIG. 5 illustrates an embodiment of an integrated circuit including an array of interconnected programmable logic elements communicated via dedicated bus interface circuitry and a shared communication channel all disposed within the array. FIG. 5 shows the portion of the integrated circuit occupied by the array. The dashed line indicates the portions of the array that are formed of interconnected programmable logic elements. The portions of the array outside of the dashed line are formed of dedicated hardwired circuitry. In particular, macrocells 28, 30, 32 and 34 are implemented as collections of the interconnected programmable logic elements appropriately programmed to perform the functions of those macrocells 28, 30, 32, 34. Also disposed within the array are a plurality of dedicated communication interface circuits 36. These dedicated communication interface circuits 36 connect to a shared communication channel 38 in the form of dedicated shared communication channel circuitry. This dedicated shared communication channel circuitry 38 may be interconnect circuitry more standard bus circuitry or a network on a chip. As illustrated, the shared communication channel extends outside of the array and provides intra-array communication between the macrocells 28, 30, 32, 34 as well as communication with circuitry outside of the array. The further circuitry outside of the array could take a variety of different forms. One particular form is a programmable processor core which responds to a stream of program instructions to perform data processing operations.

As illustrated in FIG. 5, the dedicated communication interface circuits 36 communicate with interface circuitry 40 provided within the macrocells 28, 30, 32, 34. This macrocell interface circuitry 40 may be reduced in size and complexity due to the provision of the dedicated communication interface circuits 36. The macrocell interface circuitry 40 may communicate in the native transaction protocol for the macrocell, such as an AMBA protocol. The dedicated communication interface circuits 36 may serve to translate this native macrocell protocol into a protocol used upon the shared communication channel 38. This protocol to which the translation is made be better suited to use within the array upon the shared communication channel 38 e.g. a serial communication protocol may be used or a protocol at least having a reduced bit width compared to the native protocol of the macrocells. One of the macrocells 28, 30, 32, 34 may simply be a bridge that communicates between the dedicated communication channel interface circuit 36 and an external (at least of the array) communication channel.

Figure 6:
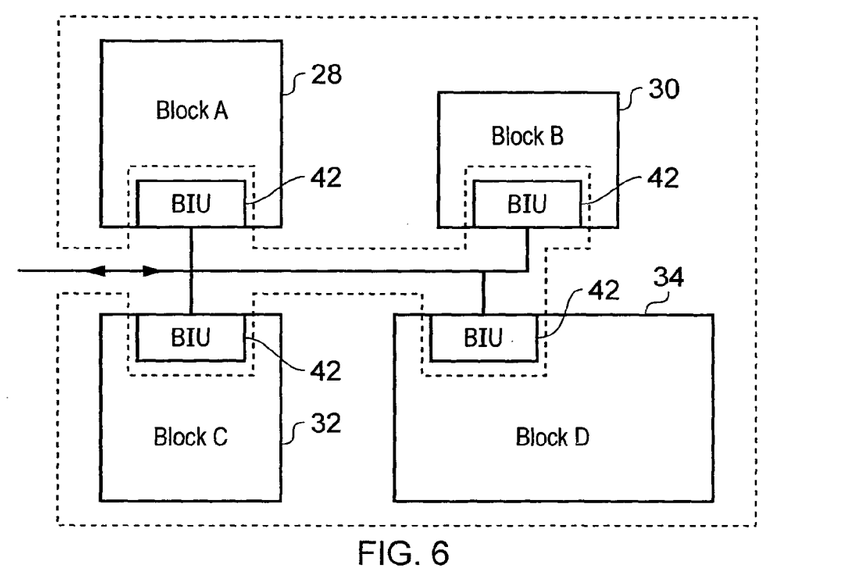
FIG. 6 schematically illustrates an alternative implementation to that of FIG. 5 in which the bus interface units are wholly provided in the form of dedicated circuitry.

FIG. 6 illustrates a modification to the embodiment of FIG. 5. In the embodiment of FIG. 6, bus interface units 42 for each of the macrocells 28, 30, 32, 34 are provided wholly in the form of the dedicated communication interface circuits implemented in the form of hardwired dedicated circuitry within the array rather than in the form of a programmed interconnected programmable logic elements either wholly (see FIG. 4) or partially (see FIG. 5).

Figure 7:
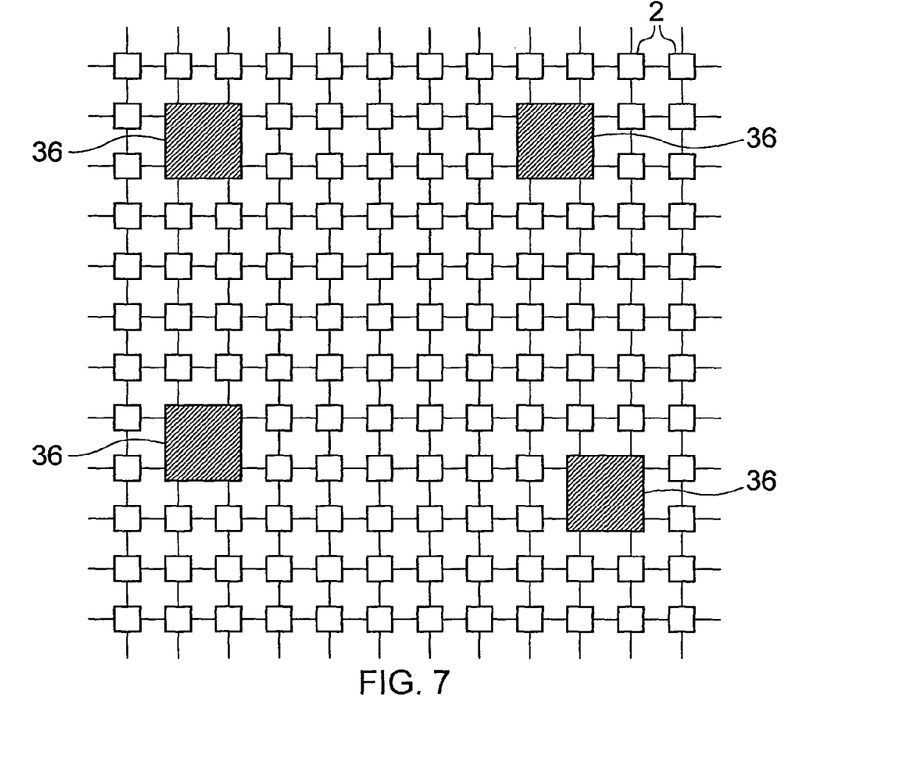
FIG. 7 schematically illustrates dedicated communication interface circuits embedded within an array of interconnected programmable logic elements.

FIG. 7 schematically illustrates dedicated communication interface circuits 36 disposed within the array of interconnected programmable logic elements 2. The dedicated communication interface circuits 36 need not all be of exactly the same form. Some may be of the form illustrated in FIG. 6, whereas others may be in the form illustrated in FIG. 5. The distribution of these dedicated communication interface circuits 36 throughout the array has the result that when a macrocell is implemented within the array, there is a high probability that there will be a nearby (and hence efficiently accessible) dedicated communication interface circuit 36 available for use by the macrocell.

Figure 8:
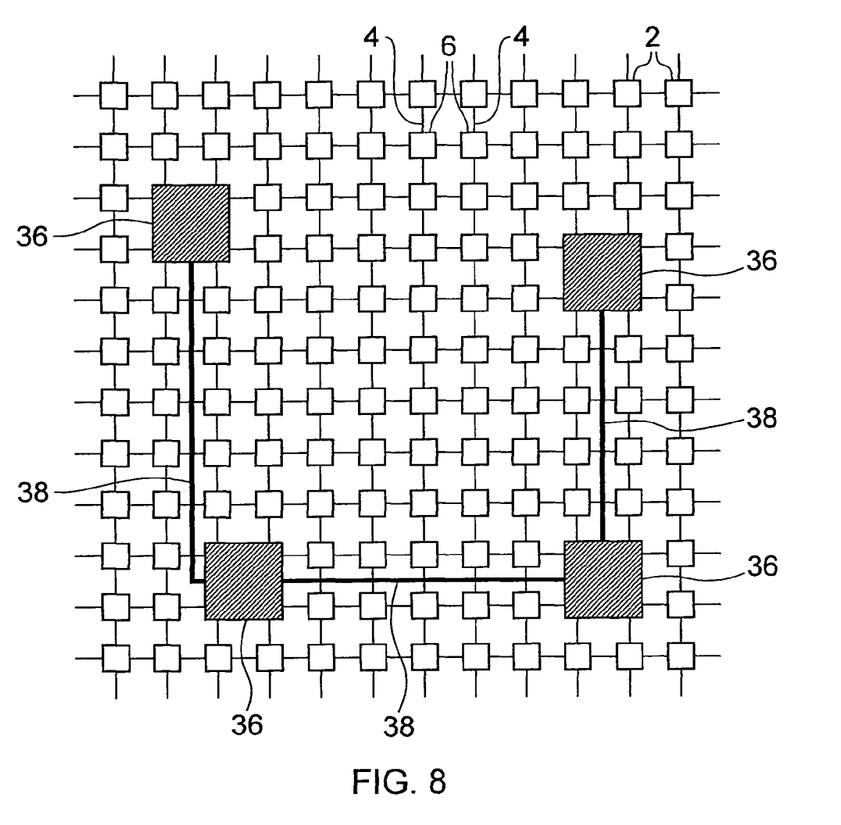
FIG. 8 schematically illustrates a modification of the embodiment of FIG. 7 including dedicated shared communication channel circuitry.

FIG. 8 illustrates a modification of the embodiment of FIG. 7. In the embodiment of FIG. 8 dedicated shared communication channel circuitry 38 is shown as provided within the array. This dedicated shared communication channel circuitry 38 may be used to provide the communication between the dedicated communication interface circuits 36 instead of using the one or more conductors 4 and switch blocks 6 that are provided for the programmable connections between the logic elements 2. Again, distributing the dedicated communication channel circuitry 38 through the array enables an implemented macrocell using the logic elements 2 to have relatively local access to the shared communication channel.

Figure 9:
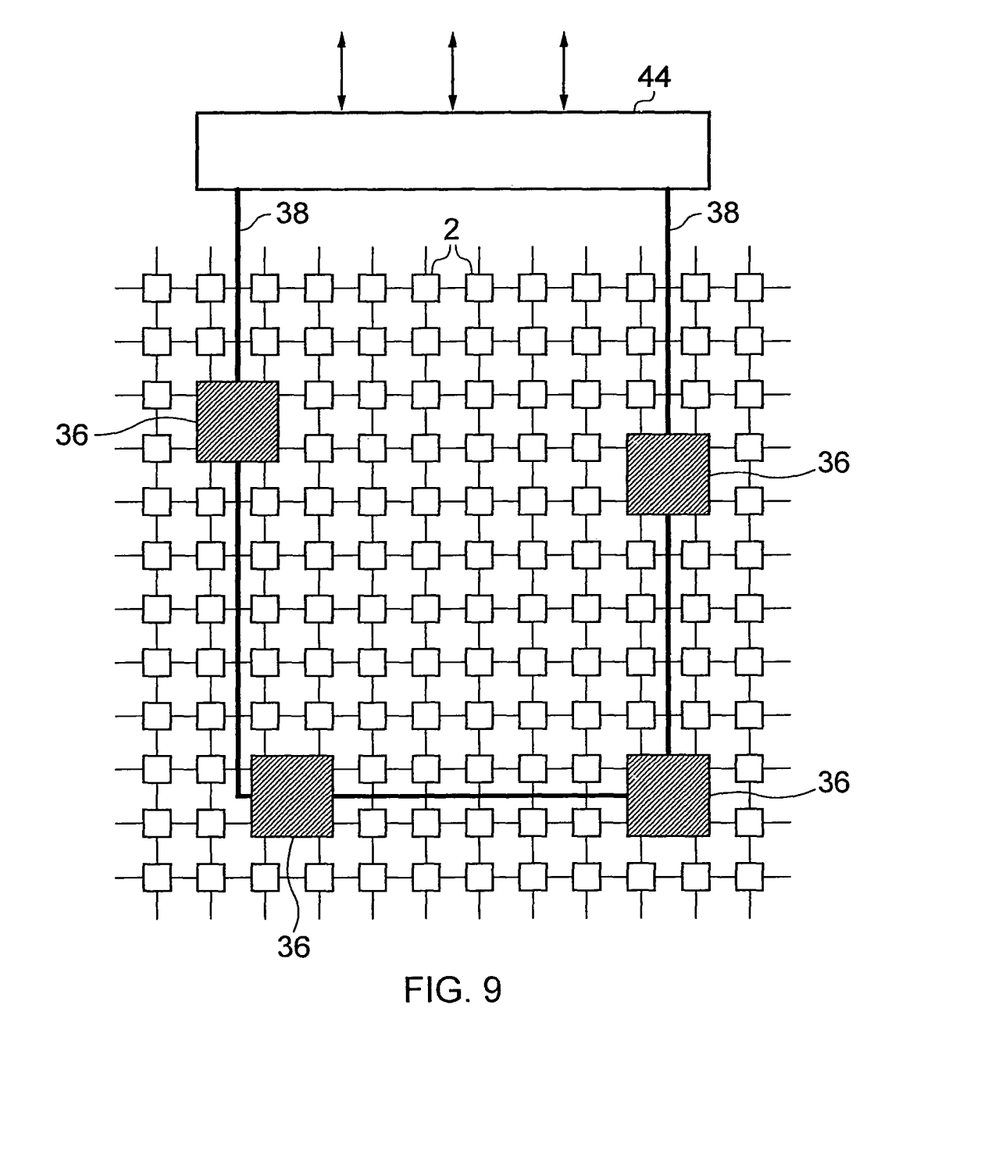
FIG. 9 schematically illustrates a further embodiment in which dedicated external bridge circuitry is provided.

FIG. 9 illustrates a modification to the embodiment of FIG. 8. In this embodiment, external bridge circuitry 44 has been added to provide a link between the dedicated communication channel circuitry 38 and the circuitry outside the array, but still within the integrated circuit. As previously mentioned, the dedicated communication channel circuitry 38 within the array may use a different communication protocol to that used outside the array. In this case, the bridge circuitry 44 can provide an appropriate translation (e.g. protocol conversion, input and output buffering etc) between the different communication protocols. A communication protocol adapted for use within the array may be different to one adapted for use outside of the array.

Figure 10:
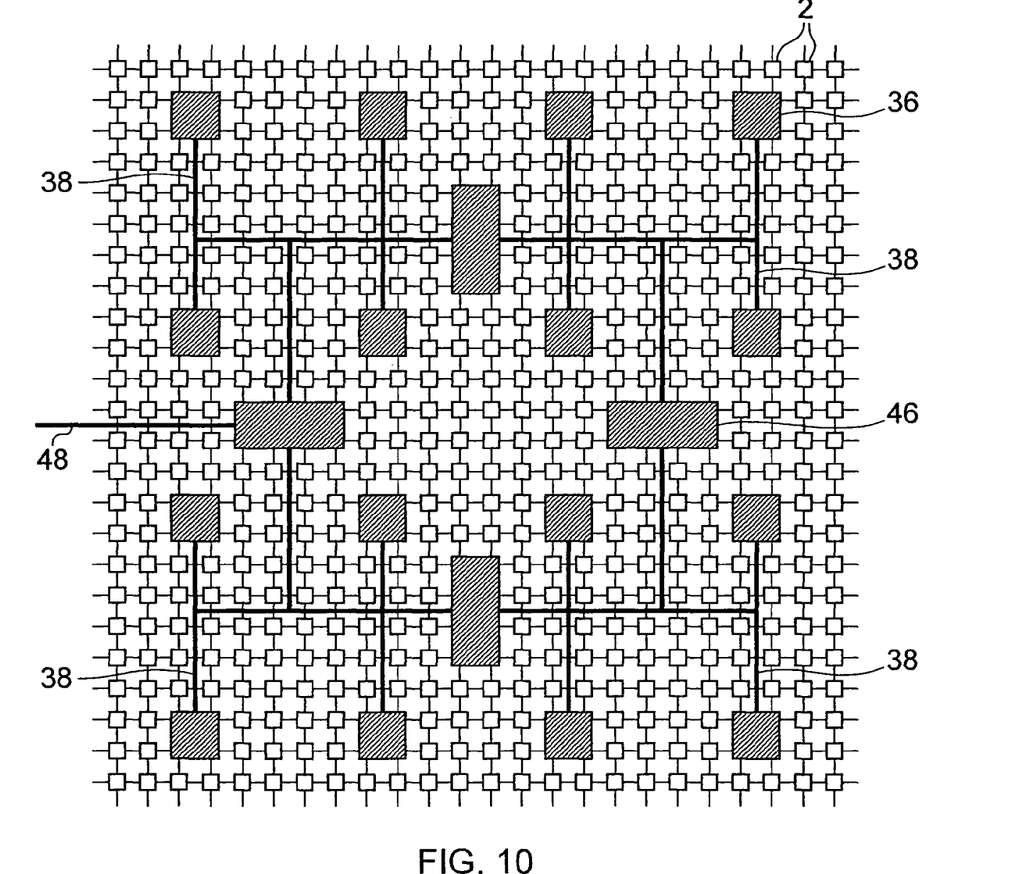
FIG. 10 schematically illustrates a hierarchical arrangement of a plurality of independent shared communication channels within an array of interconnected programmable logic elements.

FIG. 10 schematically illustrates a hierarchical arrangement of shared communication channels within an array. As will be seen, the array includes multiple dedicated communication interface circuits 36 providing a local interface with dedicated hardware to their surrounding programmable logic elements 2. Each of the dedicated communication interface circuits 36 is connected to a local dedicated shared communication channel 38. A plurality of these local dedicated shared communication channels 38 are provided and linked in a hierarchical manner. The local dedicated shared communication channel circuitry 38 is connected via intra-array bridge circuits 46. Separating the local dedicated communication channel circuitry 38 in this way facilitates less contention in respect of local communication. At a higher level in the hierarchy of shared communication channels, as illustrated, one of the intra-array bridge circuits 46 links to a dedicated communication channel 48 which extends out of the array and provides communication with circuitry provided on the integrated circuit outside of the array. The bridge 46 connecting to this higher level shared communication channel 48 may also include a protocol conversion.

Figure 11:
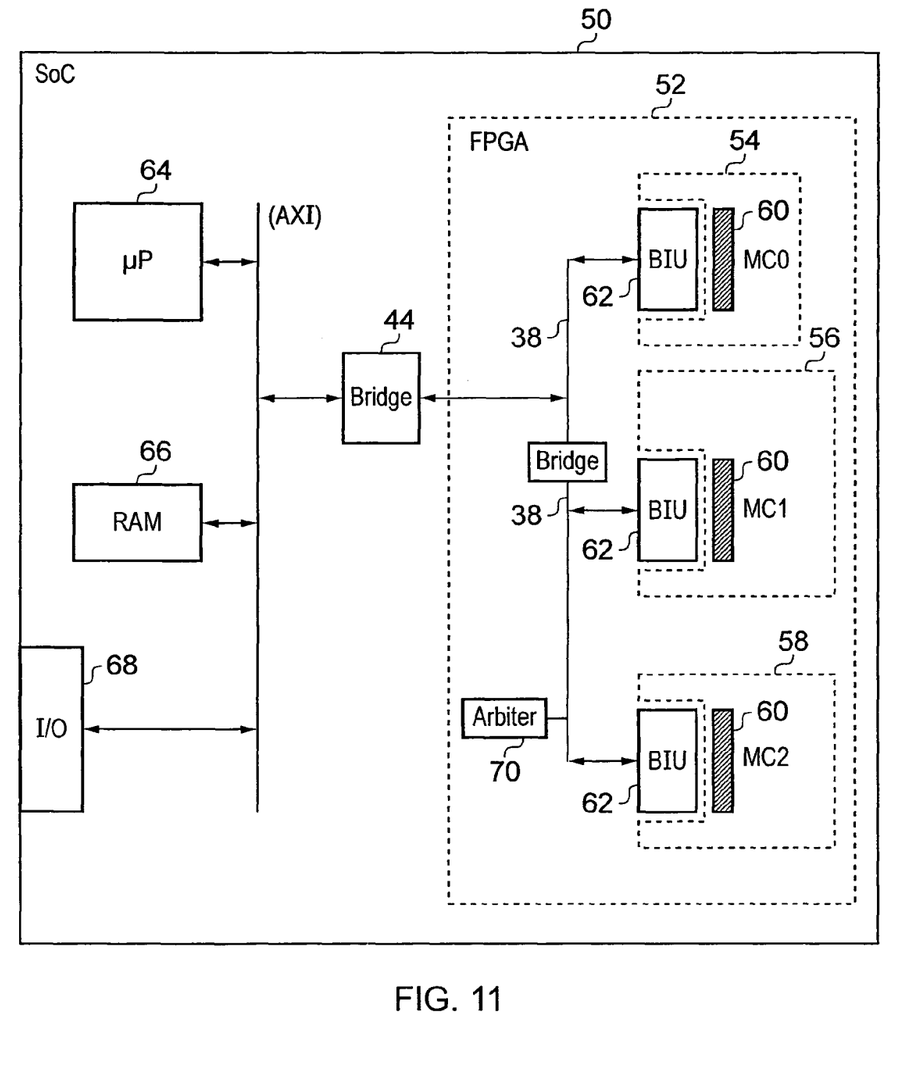
FIG. 11 schematically illustrates an integrated circuit including both an array of interconnected programmable logic elements and further functional units provided in the form of dedicated circuitry together serving to form a system-on-chip integrated circuit.

FIG. 11 illustrates an integrated circuit 50 including an array 52 of interconnected programmable logic elements. In this example, these programmable logic elements form a field programmable gate array. The gate array may also be a time multiplexed field programmable gate array in other embodiments.

Implemented within the array 52 are a plurality of different macrocells 54, 56 and 58. Each of these 54, 56, 58 includes a portion of bus interface circuitry 60 implemented using the programmable logic elements within the macrocell 54, 56, 58. This portion of bus interface circuitry 60 communicates with dedicated communication interface circuits 62 which are hardwired rather than being formed from programmable logic elements. These dedicated communication interface circuits 62 connect to dedicated shared communication channel circuitry 38 and communicate via a bridge circuit 44 with further processing circuits 64, 66 and 68 in the form of a processor core 64, a random access memory 66 and input/output circuitry 68. Within the array 52 there is also provided an arbiter circuit 70 which arbitrates access to the local dedicated communication channel 38 by the macrocells 56 and 58. The arbiter circuit 70 may be formed of programmable logic elements or may be a dedicated hardwired arbiter circuitry 70.

The communication channel protocol used within the array 54 may be address based such that each of the dedicated communication interface circuits 62 has one or more associated addresses. A communication transaction being routed on the shared communication channel circuitry 38 has an address indicating its destination sent as part of the transaction and is routed to its destination so as to reach the dedicated communication interface circuit 62 having the matching address allocated thereto. The different macrocells 54, 56 and 58 have different memory address ranges associated therewith and communication transactions within those ranges are routed to the appropriate macrocell 54, 56, 58.

The communication transactions sent via the dedicated shared communication circuitry 38 take a variable amount of time to complete. This time may be dependent upon contention for access to the communication channel, such as is controlled by the arbiter circuit 70. The time to completion may also depend upon the physical distance the transaction has to travel as it may traverse one or more bridge circuits, or one or more buffering registers within the channel, and each of these will introduce a delay, which may in itself be variable. Thus, the data transfers within the array 52 have the character of higher level communication protocols whereby the time taken to complete the transactions can vary as contrasted with a simple data signal sent upon a dedicated conductor which has a fixed time to complete and a fixed timing.

This use of higher level transaction protocols within the array 52 is facilitated by the dedicated communication interface circuit 62 serving to output control signals to the macrocells 54, 56, 58 (composed of logic elements) with which they are associated. These control signals indicate parameters of the communication being provided, such as that the communication channel interface cannot accept more data for communication, data sent was lost, data sent has been received and other communication control signals.

Figure 12:
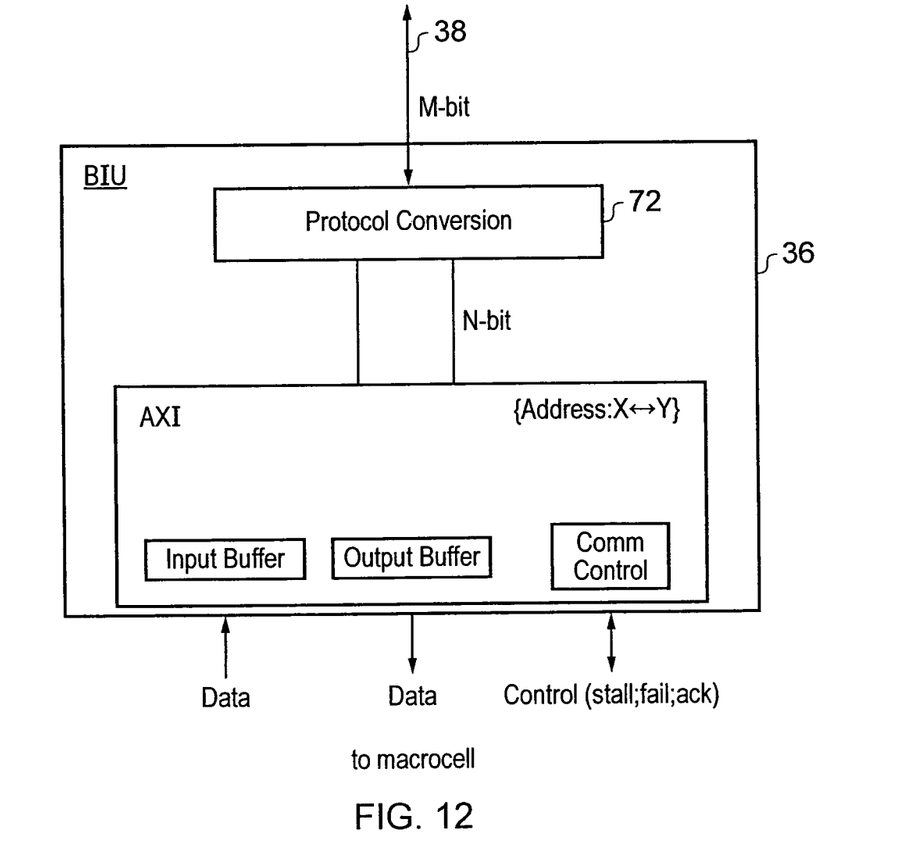
FIG. 12 schematically illustrates example contents of a dedicated communication channel interface circuit that may be provided within an array of interconnected programmable logic elements.

FIG. 12 illustrates the contents of a dedicated communication channel interface circuit 36 in more detail. The dedicated communication channel interface circuit 36 has an interface to the macrocell, which in this example may be an AXI interface associated with memory addresses X to Y. This interface provides an input buffer and an output buffer as well as communication control circuitry. The control signals include a stall signal, a fail signal and an acknowledge signal. The AXI communication protocol is a N-bit communication protocol. Also disposed within the dedicated communication channel interface circuitry 36 is protocol conversion circuitry 72. This converts the N-bit transactions to narrower M-bit transactions upon the shared communication channel 38. The different bit-widths of these protocols results in a different number of bits per cycle being communicated over these respective communication channels. The protocol conversion circuitry 72 both encodes from the N-bit transactions to the M-bit transactions and decodes in the opposite direction. Thus, the internal traffic over the shared communication channel 38 is M-bit transactions whereas the various macrocells communicate via N-bit transactions.

Figure 13:
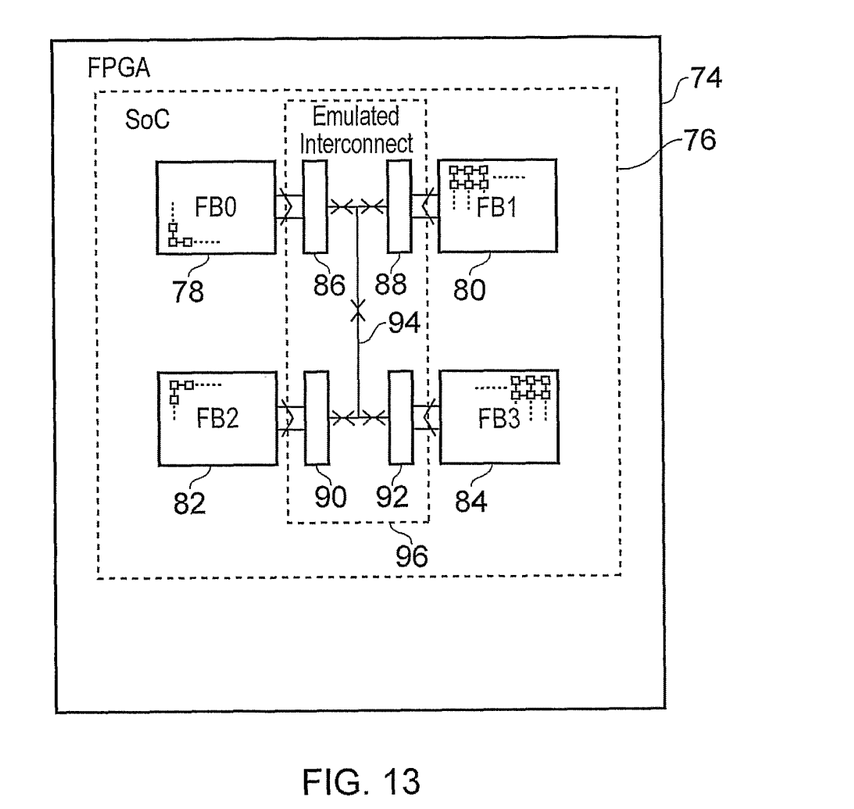
FIG. 13 schematically illustrates a field programmable gate array used to implement a system-on-chip integrated circuit design.

FIG. 13 schematically illustrates a field programmable gate array (FPGA) 74 used to implement a system-on-chip integrated circuit design 76. The system-on-chip integrated circuit 76 provides a plurality of functional units 78, 80, 82, 84 each formed of programmable logic elements configured to provide the functionality of the functional unit 78, 80, 82, 84 concerned. Thus, for example, functional unit 78 may be formed of programmable logic elements configured to provide the functionality of a processor core and the functional unit 80 may be formed of programmable logic elements configured to provide the functionality of a memory controller. The other functional units 80, 82 are formed of programmable logic elements and may be configured to provide the functionality of other desired functional units, such as digital signal processors, direct memory access units, cache controllers etc. The different functional units 78, 80, 82, 84 may be designed and provided by different organisations. A user wishing to build a system-on-chip integrated circuit will typically purchase a processor design from one vendor, a digital signal processor design from another vendor and in this way assemble the various component functional units required to give the overall functionality to the system-on-chip integrated circuit 76 that they wish to produce.

Within such system-on-chip integrated circuits it is normal that the different functional units 78, 80, 82, 84 communicate with one another via an interconnect circuit. Such an interconnect circuit typically provides configurable point-to-point connections as required between the different functional units with appropriate arbitration and control using transmission protocols. Examples of such interconnect circuits are those provided by ARM Limited of Cambridge England utilising the AXI transaction protocol.

While it is possible that the programmable logic elements of the FPGA 74 could be configured to provide the functionality of the interconnect circuit required by the system-on-chip integrated circuit 76, such an approach would be disadvantageously inefficient. As intra-array communication is highly likely to be required when a system-on-chip integrated circuit 76 is implemented using a FPGA 74, a more efficient approach is to provide a plurality of dedicated communication interface circuits 86, 88, 90, 92 distributed throughout the FPGA 74. These dedicated communication interface circuits 86, 88, 90, 92 are in turn coupled to one or more shared communication channels 94 over which communication transactions can be transmitted between the dedicated communication interface circuits 86, 88, 90, 92. The plurality of dedicated communication interface circuits 86, 88, 90, 92 and with the one or more shared communication channels 94 are configured by part of the configuration of the FPGA 74 to emulate an interconnect circuit 96 that would normally be included within the system-on-chip integrated circuit 76. Thus, the designer of the system-on-chip integrated circuit 76 may use a largely similar design to that which would be implemented on an application specific integrated circuit implementation of that system-on-chip integrated circuit 76 and apply this design to a FPGA 74 implemented version of the system-on-chip integrated circuit 76. The different functional units 78, 80, 82, 84 are implemented by suitably configuring the programmable logic elements. The interconnect circuit 96 is provided by suitably configuring the plurality of dedicated communication integrated circuits 86, 88, 90, 92 and the one or more shared communication channels 94.

The dedicated communication interface circuits 86, 88, 90, 92 provide the same interconnect interface to the functional units 78, 80, 82, 84 as would be provided by the interconnect circuit 96 which is being emulated. For example, the dedicated communication interface circuits 86, 88, 90, 92 may present an AXI interface to the functional unit 78, 80, 82, 84 in accordance with the AXI architecture and transaction protocols designed by ARM Limited of Cambridge England.

The present techniques recognised that the use of a plurality of dedicated communication interface circuits 86, 88, 90, 92 and the one or more shared communication channels to emulate the interconnect circuit 96 has the result that the hardware which is forming the emulated interconnect circuit 96 will typically have a higher communication bandwidth than that associated with the rate at which the functional unit 78, 80, 82, 84 can generate or consume communication transactions. The implementation of the functional unit 78, 80, 82, 84 by programmable logic elements configured to provide the same functionality as if those circuit designs had been implemented in dedicated circuitry (e.g. as an application specific integrated circuit) has the consequence that they will typically operate significantly slower. The use of FPGA implementations is nevertheless advantageous in other respects, such as the relative speed with which such implementations may be formed by suitably configuring an already existing general purpose FPGA 74, the relative ease with which such designs may be modified and other practical considerations. However, it is nevertheless true that designs implemented by the programmable logic elements of an FPGA 74 will operate more slowly than the speeds capable of being achieved by dedicated circuitry.

In the context of the design of FIG. 13 this has the result that the dedicated communication interface circuits 86, 88, 90, 92 and the one or more shared communication channels 94 are typically capable of a higher bandwidth of communication than is required for individual point-to-point communications between the functional unit 78, 80, 82, 84. The present techniques recognise and exploit this difference in capability by configuring the plurality of dedicated communication interface circuits 86, 88, 90, 92 and the one or more shared communication channels 94 such that a plurality of interconnect channels within the interconnect circuit 76 being emulated can share one of the one or more shared communication channels 94. If the interconnect circuit 96 were implemented using an application specific integrated circuit, then the interconnect channels would be dedicated to the particular transactions they were performing (at least for the time in which those transactions were performed). However, given the greater bandwidth capability of the plurality of dedicated communication interface circuits 86, 88, 90, 92 and the one or ore communication channels 94, it is possible to multiplex a plurality of interconnect channels (such as a plurality of point-to-point interconnect channels between different functional units 78, 80, 82, 84) so as to more efficiently use the communication capabilities of the communication hardware provided within the FPGA 74. Thus, comparatively less resource need be consumed by the plurality of dedicated communication interface circuits 86, 88, 90, 92 and the one or more shared communication channels 94 since multiple interconnect channels can be multiplexed together over these communication mechanisms thereby exploiting the greater bandwidth that is provided by these dedicated circuits and channels compared with the speed of operation of the functional units 78, 80, 82, 84 implemented using the programmable logic elements.

It will be appreciated that the sharing of the communication channels 94 can be achieved in a variety of different ways. The sharing may be achieved by time-division-multiplexing, frequency-division-multiplexing, code-division-multiplexing or in some other way. The effect of this multiplexing is that the transactions between the functional units 78, 80, 82, 84 are overlapped with one another on a shared communication channel 94. Thus, before one communication transaction has completed another will already be in progress on the shared communication channel. As an example, if one transaction across the interconnect channel is to transfer a 32-bit data word, then this communication transaction may be divided into the transfer of four 8-bit portions of the full 32-bit data word when it is transferred across the shared communication channel 94. These four 8-bit portions of the 32-bit data word may be interleaved with portions of another communication transaction across another interconnect channel between different functional units 78, 80, 82, 84. This is an example of time-division-multiplexing the shared communication channel between a plurality of interconnect channels being emulated.

Figure 14:
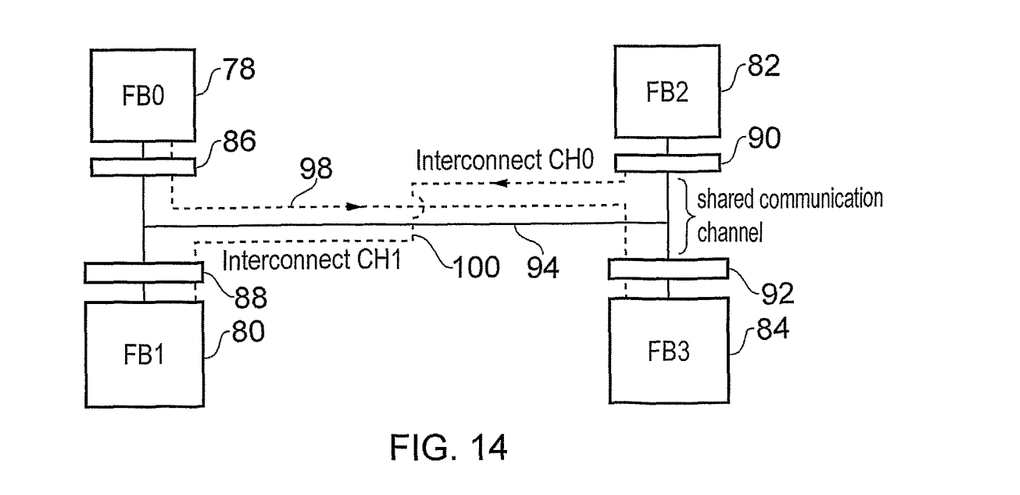
FIG. 14 schematically illustrates the relationship between an emulated interconnect circuit and the use of dedicated communication interface circuits and a shared communication channel.

FIG. 14 schematically illustrates the arrangement of FIG. 13 showing multiple interconnect channels 98, 100 being emulated by the plurality of dedicated communication interface circuits 86, 88, 90, 92 and the shared communication channel 94. From the point of view of the functional unit 78, 80, 82, 84, there is a virtual interconnect circuit 96 provided using which they communicate with the other functional units 78, 80, 82, 84 using their interconnect interface in the same manner as if the system-on-chip integrated circuit 76 were implemented using all dedicated circuitry within an application specific integrated circuit. However, the interconnect circuit 96 is in fact emulated using a plurality of dedicated communication interface circuits 86, 88, 90, 92 and a shared communication channel 94 (appropriately configured for the interconnect circuit being emulated) operating with a higher bandwidth than required by the individual functional unit 78, 80, 82, 84 such that a plurality of interconnect channels can be multiplexed together on a shared communication channel 94 thereby making more efficient use of the circuit resources provided within the FPGA 74.

Figure 15:
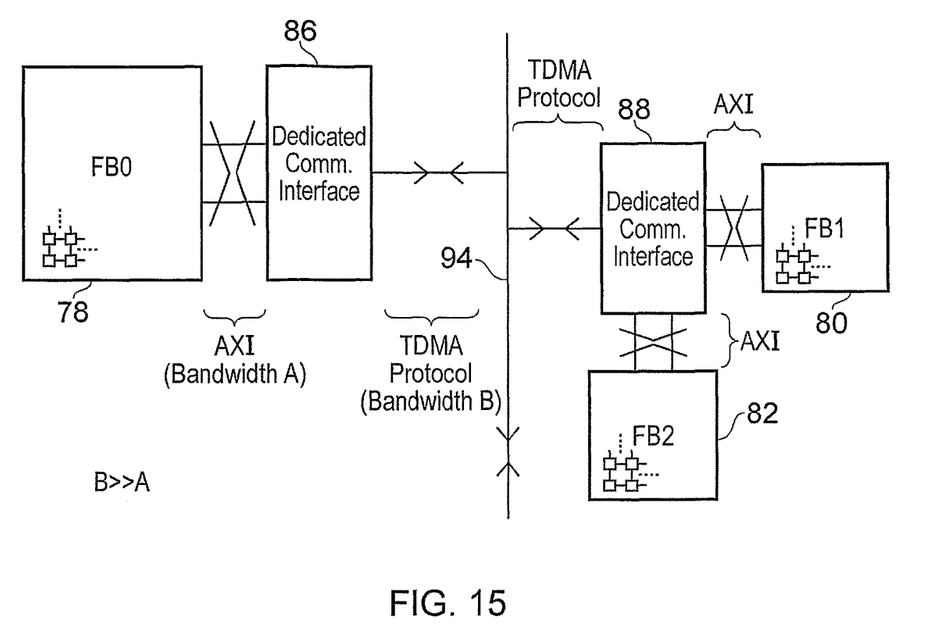
FIG. 15 schematically illustrates different communication protocols and techniques used in different portions of the communication between functional blocks of FIG. 13.

FIG. 15 schematically illustrates the different transaction protocols that may be used. In the example of FIG. 15, the dedicated communication interface 88 is shared by two functional units 80, 82. Each of these functional units communicates via an interconnect interface in the form of an AXI interface with the dedicated communication interface circuit 88. As the dedicated communication interface circuit 88 is implanted by dedicated circuitry rather than programmable logic elements, it has a speed sufficient to simultaneously support both of the interconnect interfaces to the functional units 80, 82. The dedicated communication interface circuit 88 converts the communication transactions issued with a AXI communication protocol into a time division multiplexed access protocol for transmission via the shared communication channel 94 to the dedicated communication interface circuit 86 associated with the functional unit 78. The dedicated communication interface circuit 86 converts the communication transaction back into an AXI transaction which is received by the functional unit 78. The bandwidth of the shared communication channel 94 is B and this is much larger than the bandwidth A required by the AXI interfaces to the functional unit 78, 80, 82. This permits multiple communication transactions issued by different functional units to be multiplexed together and overlapped on the shared communication channel 94 thereby making more efficient use of this resource. This technique recognises the mismatch between the speed capabilities of dedicated circuitry, such as the dedicated communication interface circuits 86, 88, 90, 92 and the shared communication channel 94, compared to the speed of operation of the functional units which are implemented by appropriately configured programmable logic elements within the FPGA 74.

Figure 16:
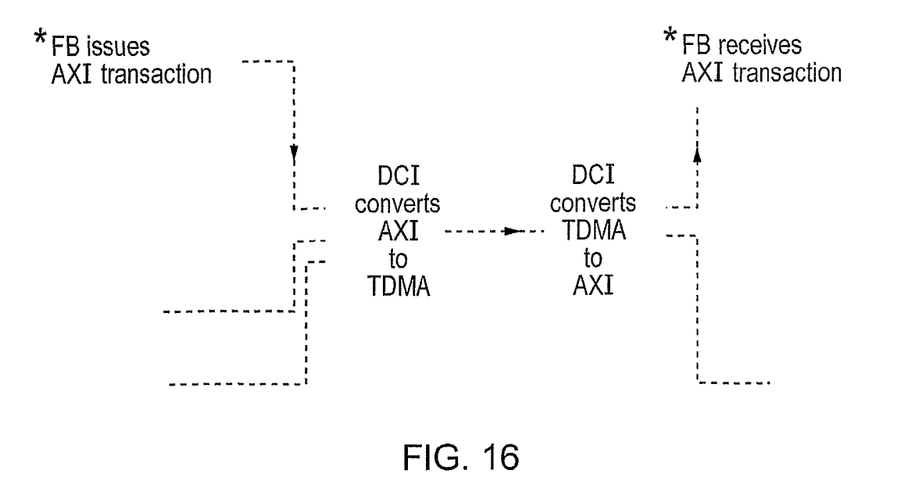
FIG. 16 schematically illustrates the form and conversions of a communication transaction passing through the communication mechanisms between functional blocks.

FIG. 16 schematically illustrates how multiple functional units may connect to a dedicated communication interface circuit and issue AXI transactions thereto using the interconnect interface intended by the designer of the system-on-chip integrated circuit 76 if the system were implemented with all dedicated circuitry. However, the interconnect circuit 96 is emulated by the plurality of dedicated communication interface circuits 86, 88, 90, 92 and the shared communication channel 94. These act together to convert the AXI transaction to a time-division-multiplexed access transaction which is transmitted across the shared communication channel 94 to the recipient dedicated communication interface circuit where it is converted back to an AXI transaction for receipt across the interconnect interface by the receiving functional unit.

The invention claimed is:

1. An integrated circuit comprising:
   an array of interconnected programmable logic elements, each logic element performing data processing controlled by a configuration stored after manufacture into said logic element;
   one or more shared communication channels providing intra-array communication within said array; and
   a plurality of dedicated communication interface circuits distributed within said array, said dedicated communication interface circuits providing access to said one or more shared communication channels; wherein
   said logic elements are configured to provide a plurality of functional units, each of said plurality of functional units emulating a macrocell communicating using a transaction protocol with other macrocells and each of said plurality of functional units having an interconnect interface for transferring multi-bit communication transactions having said transaction protocol and coupled to one of said plurality of dedicated communication interface circuits;
   said plurality of dedicated communication interface circuits and said one or more shared communication channels are controlled by said configuration to emulate an interconnect circuit configured to transfer said multi-bit communication transactions having said transaction protocol between said plurality of functional units via a plurality of interconnect channels; and
   each of said one or more shared communication channels has a communication bandwidth greater than required to emulate one of said plurality of interconnect channels such that a plurality of interconnect channels share one of said one or more a shared communication channels, said integrated circuit further comprising:
   arbiter circuitry within said array arbitrating access to said one or more shared communication channels by said plurality of dedicated communication interface circuits to control contention between said multi-bit communication transactions such that said multi-bit communication transactions complete in times that vary in dependence upon said contention controlled by said arbiter circuitry.

2. An integrated circuit as claimed in claim 1, wherein said plurality of interconnect channels are time-division-multiplexed together on said one or said one or more shared communication channel.

3. An integrated circuit as claimed in claim 1, wherein said plurality of interconnect channels are frequency-division-multiplexed together on said one or said one or more shared communication channel.

4. An integrated circuit as claimed in claim 1, wherein said plurality of interconnect channels are code-division-multiplexed together on said one or said one or more shared communication channel.

5. An integrated circuit as claimed in claim 1, wherein said one or more shared communication channels is formed of dedicated shared communication channel circuitry.

6. An integrated circuit as claimed in claim 1, wherein said one or more shared communication channels is formed of shared communication channel interconnect circuitry.

7. An integrated circuit as claimed in claim 1, wherein said one or more shared communication channels also provides communication with circuitry outside said array.

8. An integrated circuit as claimed in claim 7, comprising at least one further data processing circuit for performing data processing outside of said array, said one or more shared communication channels providing communication between at least one of said plurality of functional blocks within said array and said at least one further data processing circuit.

9. An integrated circuit as claimed in claim 8, wherein said at least one further data processing circuit comprises a data processor responsive to a stream of program instructions to perform data processing operations.

10. An integrated circuit as claimed in claim 7, wherein dedicated bridge circuitry links said one or more shared communication channels within said array with said circuitry outside said array.

11. An integrated circuit as claimed in claim 1, wherein said dedicated communication interface circuits transfer data from a source dedicated communication interface circuit to a destination dedicated communication interface circuit via said one or more shared communication channels using multi-bit transactions having an associated transaction protocol different from said transaction protocol of said interconnect circuit and including control signalling to both said source dedicated communication interface circuit and said destination dedicated communication interface circuit.

12. An integrated circuit as claimed in claim 10, wherein arbiter circuitry comprises dedicated arbiter circuitry within said array.

13. An integrated circuit as claimed in claim 1, wherein each of said plurality of dedicated communication interface circuits has one or more associated addresses such that a communication transaction can be routed across said one or more shared communication channels to a destination dedicated communication interface circuit.

14. An integrated circuit as claimed in claim 1, wherein a data transfer via said one or more shared communication channels completes in a time dependent upon at least one of concurrent use of said one or more shared communication channels for other data transfers and positions within said array of a source dedicated communication interface circuit and a destination dedicated communication interface circuit of said data transfer.

15. An integrated circuit as claimed in claim 1, wherein said plurality of dedicated communication interface circuits output one or signals to said logic elements of said array indicating one or more of:
    a dedicated communication channel interface cannot accept more data for communication;
    data sent for communication was lost; and
    data has been received.

16. An integrated circuit as claimed in claim 1, wherein at least one of said plurality of dedicated communication interface circuits comprises an output buffer for storing data to be transmitted prior to access to said one or more shared communication channels being obtained.

17. An integrated circuit as claimed in claim 1, wherein at least one of said plurality of dedicated communication interface circuits comprises an input buffer for storing data received from one or more shared communication channels prior to said data being passed to said logic elements.

18. An integrated circuit as claimed in claim 1, wherein in respect of at least one of said plurality of dedicated communication channel interface circuits data is transferred upon said one or more shared communication channels at a number of bits per cycle differing from a number of bit per cycle at which said data is communicated between said logic elements and said at least one of said plurality of dedicated communication channel interface circuits.

19. An integrated circuit as claimed in claim 1, wherein a source dedicated communication channel interface circuit data encodes to a different form data received from said logic elements and a destination dedicated communication channel interface circuit data decodes said data from said different form before passing said data to said logic elements.

20. An integrated circuit as claimed in claim 1, comprising a hierarchy of shared communication channels linked by intra-array bridge circuitry.

21. An integrated circuit as claimed in claim 1, comprising a plurality of independent shared communication channels.

22. An integrated circuit as claimed in claim 1, wherein said array comprises a field programmable gate array.

23. An integrated circuit as claimed in claim 1, wherein said array comprises a time multiplexed field programmable gate array.

24. An integrated circuit comprising:
    an array of interconnected programmable logic element means for performing data processing controlled by a configuration stored after manufacture into said logic element means;
    one or more shared communication channel means for providing intra-array communication within said array; and
    a plurality of dedicated communication interface means distributed within said array for providing access to said one or more shared communication channel means; wherein
    said logic element means are configured to provide a plurality of functional units, each of said plurality of functional units emulating a macrocell communicating using a transaction protocol with other macrocells and each of said plurality of functional units having an interconnect interface for transferring multi-bit communication transactions having said transaction protocol and coupled to one of said plurality of dedicated communication interface means;
    said plurality of dedicated communication interface means and said one or more shared communication channel means are controlled by said configuration to emulate an interconnect circuit configured to transfer said multi-bit communication transactions having said transaction protocol between said plurality of functional units via a plurality of interconnect channel means; and
    each of said one or more shared communication channel means has a communication bandwidth greater than required to emulate one of said plurality of interconnect channels such that a plurality of interconnect channels share one of said one or more a shared communication channel means, said integrated circuit further comprising:
    arbiter means with said array for arbitrating access to said one or more shared communication channel means by said plurality of dedicated communication interface means and for controlling contention between said multi-bit communication transactions such that said multi-bit communication transactions complete in times that vary in dependence upon said contention controlled by said arbiter means.

25. A method of communication within an integrated circuit having an array of interconnected programmable logic elements, each logic element performing data processing controlled by a configuration stored in said logic element, said method comprising the steps:
    communicating within said array using one or more shared communication channels and a plurality of dedicated communication interface circuits distributed within said array, said dedicated communication interface circuits providing access to said one or more shared communication channels; wherein
    said logic elements are configured to provide a plurality of functional units, each of said plurality of functional units emulating a macrocell communicating using a transaction protocol with other macrocells and each of said plurality of functional units having an interconnect interface for transferring multi-bit communication transactions having said transaction protocol and coupled to one of said plurality of dedicated communication interface circuits;
    said plurality of dedicated communication interface circuits and said one or more shared communication channels are controlled by said configuration to emulate an interconnect circuit configured to transfer said multi-bit communication transactions having said transaction protocol between said plurality of functional units via a plurality of interconnect channels; and
    each of said one or more shared communication channels has a communication bandwidth greater than required to emulate one of said plurality of interconnect channels such that a plurality of interconnect channels share one of said one or more a shared communication channels, said method further comprising:
    arbitrating access to said one or more shared communication channels by said plurality of dedicated communication interface circuits, and
    controlling contention between said multi-bit communication transactions such that said multi-bit communication transactions complete in times that vary in dependence upon said contention.

* * * * *